(12) United States Patent
Berglund et al.

(10) Patent No.: US 9,167,731 B2
(45) Date of Patent: Oct. 20, 2015

(54) HIGH VOLTAGE SHIELDING DEVICE AND A SYSTEM COMPRISING THE SAME

(71) Applicant: ABB Reasearch Ltd., Zurich (CH)

(72) Inventors: Mats Berglund, Borlange (SE); Uno Gafvert, Vasteras (SE); Ralf Hartings, Ludvika (SE); Tor Laneryd, Vasteras (SE); Tommy Larsson, Ludvika (SE); Joachim Schiessling, Enkoping (SE); Peter Astrand, Balinge (SE)

(73) Assignee: ABB Reasearch Ltd. (CH)

( * ) Notice: Subject to any disclaimer, the term of this patent is extended or adjusted under 35 U.S.C. 154(b) by 237 days.

(21) Appl. No.: 13/736,735

(22) Filed: Jan. 8, 2013

(65) Prior Publication Data

US 2013/0120956 A1    May 16, 2013

Related U.S. Application Data

(63) Continuation of application No. PCT/EP2011/061375, filed on Jul. 6, 2011.

(60) Provisional application No. 61/362,562, filed on Jul. 8, 2010.

(51) Int. Cl.
*H05K 9/00*     (2006.01)
*H01F 27/04*    (2006.01)
*H01F 27/36*    (2006.01)

(52) U.S. Cl.
CPC .................. *H05K 9/00* (2013.01); *H01F 27/04* (2013.01); *H01F 27/362* (2013.01)

(58) Field of Classification Search
CPC ....... H01F 27/12; H01F 27/322; H01F 27/02; H02G 3/04; H05K 9/00

USPC .................. 361/816; 174/169, 142, 143, 148, 174/147 R, 75 D
See application file for complete search history.

(56) References Cited

U.S. PATENT DOCUMENTS

| 4,639,282 | A  | * | 1/1987 | Moritz ............................ 156/53 |
| 6,218,627 | B1 |   | 4/2001 | Shindo et al. |
| 2009/0108973 | A1 | * | 4/2009 | Berglund et al. ............... 336/94 |
| 2010/0073006 | A1 | * | 3/2010 | Gilliland ....................... 324/457 |

FOREIGN PATENT DOCUMENTS

| DE | 1152733 B      | 8/1963 |
| DE | 102006038221 A1 | 2/2008 |

(Continued)

OTHER PUBLICATIONS

International Search Report & Written Opinion of the International Searching Authority Application No. PCT/EP2011/061375 Completed: Oct. 12, 2011; Mailing Date: Oct. 20, 2011 12 pages.

*Primary Examiner* — Jenny L Wagner
*Assistant Examiner* — Michael P McFadden
(74) *Attorney, Agent, or Firm* — Whitmyer IP Group LLC

(57) ABSTRACT

A high voltage shielding device including a main body having an enclosing outer solid insulating wall, an outer electrode arranged on the solid insulating wall providing a first level of insulation to the outer electrode, and a first inner electrode which is uninsulated or has a coating providing a second level of insulation, which second level of insulation is lower than the first level of insulation. The first inner electrode is oriented relative the outer electrode in such a way that the first inner electrode mainly shields a component of an electric field which is perpendicular to a component of an electric field mainly shielded by the outer electrode.

12 Claims, 3 Drawing Sheets

(56) References Cited

FOREIGN PATENT DOCUMENTS

| EP | 1347469 | A1 | 9/2003 |
| WO | 2007111564 | A1 | 10/2007 |
| WO | 2009003816 | A1 | 1/2009 |

* cited by examiner

Section A-A

HIGH VOLTAGE SHIELDING DEVICE AND A SYSTEM COMPRISING THE SAME

FIELD OF THE INVENTION

The invention generally relates to shielding in high voltage applications and in particular to a shielding device for shielding a transformer to bushing connection in High Voltage Direct Current (HVDC) transformers.

BACKGROUND OF THE INVENTION

In very high voltage power systems such as those handling 500 kV and above, proper insulation between different units of the system is important so as to ensure the safe operation thereof.

As one example, the connection between power transformers and bushings, which connection provides a high voltage interface between e.g. a power grid and the power transformer must be insulated for protection against for instance arcing which may occur due to the high voltages involved. Thereby the risk of damaging the power transformer or any other power equipment in the vicinity of the power transformer is reduced.

A bushing guides a high voltage conductor from outside the power transformer through the grounded power transformer housing, whereby the conductor is connected to a winding of a leg of the power transformer core contained in the housing.

In the transformer and in the bushing, typically transformer oil or similar dielectric fluid or gas is provided so as to insulate the power transformer and the bushing.

Typically the bushing conductor and transformer conductor connection is shielded for reducing the stress attained in this area due to the very high electric fields which are present.

WO 2007/111564 discloses a high voltage insulation system where the connection between the bushing conductor and the transformer conductor is shielded by means of a shielding electrode. Several insulation barriers are fastened to the shielding electrode so as to subdivide the oil volume around the electrode. Thereby the concentration of voltage stress due to the restriction of the current flow induced by inter alia the insulation barriers, is divided between the shielding electrode and a cylindrical barrier of the insulating system.

A drawback with the solution presented in WO 2007/111564 is that it may increase the electric field stress in the insulation system.

SUMMARY OF THE INVENTION

An object of the present invention is to provide an improved shielding device for HVDC applications. In particular, it would be advantageous to achieve a high voltage shielding device, which when arranged in an insulation system reduces the electric stress in the insulating system.

Accordingly, there is provided a high voltage shielding device comprising:
a main body having an enclosing outer solid insulating wall,
an outer electrode arranged on the solid insulating wall providing a first level of insulation to the outer electrode, and
a first inner electrode which is uninsulated or has a coating providing a second level of insulation, which second level of insulation is lower than the first level of insulation,
wherein the first inner electrode is oriented relative the outer electrode in such a way that the first inner electrode mainly shields a component of an electric field which is perpendicular to a component of an electric field mainly shielded by the outer electrode.

There is always a limited amount of charge carriers in the oil of e.g. a transformer. When an electric field having one polarity is applied to the oil, the charge carriers will move through the oil, i.e. a current will flow. In short oil gaps, e.g. formed between layers of pressboard, or where the electric field is high, the free charge carriers will be transported quickly through the oil in the gap to the pressboard surfaces. This process is faster in short oil gaps than in oil gaps having a lower electric field or a greater size. Thus, when short and long oil gaps are combined in a sequence, the consequence is that the charge carriers in the short oil gaps are carried faster through the gap and the oil in the gap hence becomes less conductive. The lower conductivity implies a higher voltage drop and thus higher electric field stress. The charge carriers which are carried from the oil are deposited on the pressboard surfaces.

In HVDC systems where there is no or relatively little alternation of the voltage, electric shielding of the bushing to transformer connection by means of inter alia oil gaps increases the electric field stress.

An effect which may be obtainable by the invention is that when the high voltage shielding device is used in a high voltage insulating system where current flows there will be no gaps between the insulating fluid or gas and the outer solid insulating wall. In particular, the outer electrode may shield electric fields in the radial direction of the high voltage shielding device and the first inner electrode may shield electric fields in the axial direction of the high voltage shielding device. Since the outer electrode is arranged on the solid insulating wall, no gaps are provided between the outer electrode and the solid insulating wall, which would have resulted in a local variation of the electric field in the radial direction.

In particular, the present high voltage shielding device has no barriers attached to it for creating oil gaps when installed in a high voltage insulating system.

That an electrode, i.e. the first inner electrode or the outer electrode mainly shields a component of an electric field in a specific direction is to be construed as an orientation of the electrode in which it shields an electric field more efficiently than in any other direction.

In an embodiment in which the first inner electrode is provided with coating layer, the resistivity of the first inner electrode may be increased compared to when it is not insulated, resulting in more efficient shielding. Beneficially, the insulation of the first inner electrode prevents or at least reduces the risk that charges are carried from the first inner electrode to the surrounding oil when the high voltage shielding device is arranged in an high voltage insulating system. In particular, the lower insulation level compared to the first insulation level of the outer electrode provides for a greater amount of shielding by the first inner electrode in relation to the shielding provided radially by the outer electrode.

A side of the outer electrode facing the solid insulating wall may present a surface which is in contact with the solid insulating wall the entire length of the outer electrode. Thereby, it may be ensured that no gaps between the outer electrode and the solid insulating wall occur.

The high voltage shielding device may further comprise a second inner electrode facing the first inner electrode, wherein the first inner electrode is uninsulated or has the second level of insulation. The second inner electrode combined with the first inner electrode provides a more efficient shielding of the electric field in the axial direction of the high voltage shielding device.

The outer electrode may be arranged on an inner surface of the solid insulating wall. Thereby, the shielding by means of the outer electrode may become more efficient. The inner surface is herein defined as a surface which is not external to the high voltage shielding device, i.e. a surface facing towards the center of the device.

The main body may have a through opening extending centrally through the main body. Hence, in an insulating system comprising e.g. a bushing to transformer connection may be arranged axially in the through opening of the main body when the high voltage shielding device is installed in e.g. an insulation system.

The main body may have a rotationally symmetric shape with respect to a central axis parallel with the through opening and which central axis defines a center of the through opening. Thereby, uniform shielding may be achieved in the radial directions with respect to the central axis of the high voltage shielding device.

The outer electrode may extend longitudinally parallel to the central axis. The radial electric field may hence be shielded.

The first inner electrode may extend longitudinally in a direction transverse to the central axis. The axial electric field may hence be shielded.

The outer electrode may have a curvature. Thereby, the outer electrode may also provide shielding of part of the axial electric field or any electric field transverse to the radial and axial electric fields.

The insulating wall may be of a homogeneous material. Thereby it may be ensured that the insulating wall as such does not provide any gaps such as oil gaps when used in a high voltage insulting system.

The high voltage shielding device may comprise a support member arranged to support each of the first inner electrode, the second inner electrode, and the outer electrode. Thereby, the said electrodes are mechanically coupled and the high voltage shielding member can be manufactured in a simple way, while providing a durable design.

The high voltage shielding device may advantageously be arranged in a high voltage insulation system comprising: a bushing having a conductor connectable to a transformer conductor, wherein the high voltage device is arranged to shield the connection between the conductor and the transformer conductor when connected.

The high voltage shielding device may be arranged to enclose the connection between the conductor and the transformer conductor.

The high voltage shielding device and the bushing may be immersed in transformer oil.

The high voltage insulation system may further comprise a cylindrical insulation barrier enclosing the high voltage shielding device.

Further features and advantages of the present invention will be evident from the following description.

BRIEF DESCRIPTION OF THE DRAWINGS

The invention and further advantages thereof will now be described by non-limiting examples with reference to the accompanying drawings, of which:

FIG. 1b shows a schematic top view of the high voltage shielding device in FIG. 1a.

DETAILED DESCRIPTION OF THE INVENTION

In the following description, for purpose of explanation and not limitation, specific details are set forth, such as particular techniques and applications in order to provide a thorough understanding of the present invention. However, it will be apparent for a person skilled in the art that the present invention may be practiced in other embodiments that depart from these specific details. In other instances, detailed description of well-known methods and apparatuses are omitted so as not to obscure the description of the present invention with unnecessary details.

Figure 1A:
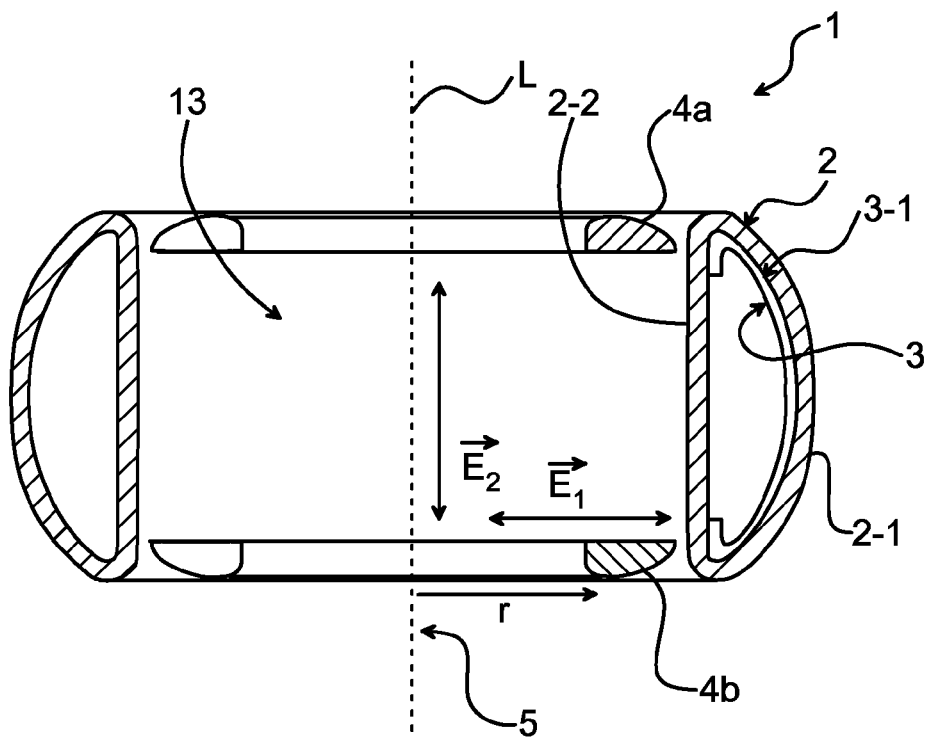
FIG. 1a shows a schematic cross-sectional view of an example of a high voltage shielding device according to the invention, the cross section being taken along section A-A of the high voltage shielding device in FIG. 1b.

With reference to FIG. 1a, an example of a high voltage shielding device 1 according to the invention is shown. In order to simplify FIG. 1a, no elements on the left hand side of the symmetry axis L have been identified, although typically both the left hand side and the right hand side of the high voltage shielding device 1 are similar.

The high voltage shielding device 1 may be particularly suitable for shielding a bushing to transformer connection in a HVDC transformer for voltages above e.g. 500 kV.

The high voltage shielding device 1 comprises a main body 2 presenting an outer insulating solid wall 2-1 of the high voltage shielding device 1. The outer insulating solid wall 2-1 encloses the interior 13 of the high voltage shielding device 1. The high voltage shielding device 1 further comprises an outer electrode 3, and a first and a second inner electrode 4a and 4b, respectively. The outer electrode 3 and the first and second inner electrodes 4a and 4b may comprise e.g. aluminium, copper or any other conducting material having similar characteristics.

The main body 2 has a central axis L around which axis L a through opening 5 extends through the main body 2. The through opening forms part of the interior 13 of the high voltage shielding device 1. The through opening 5 extends in a direction from the first inner electrode 4a to the second inner electrode 4b.

Figure 1B:
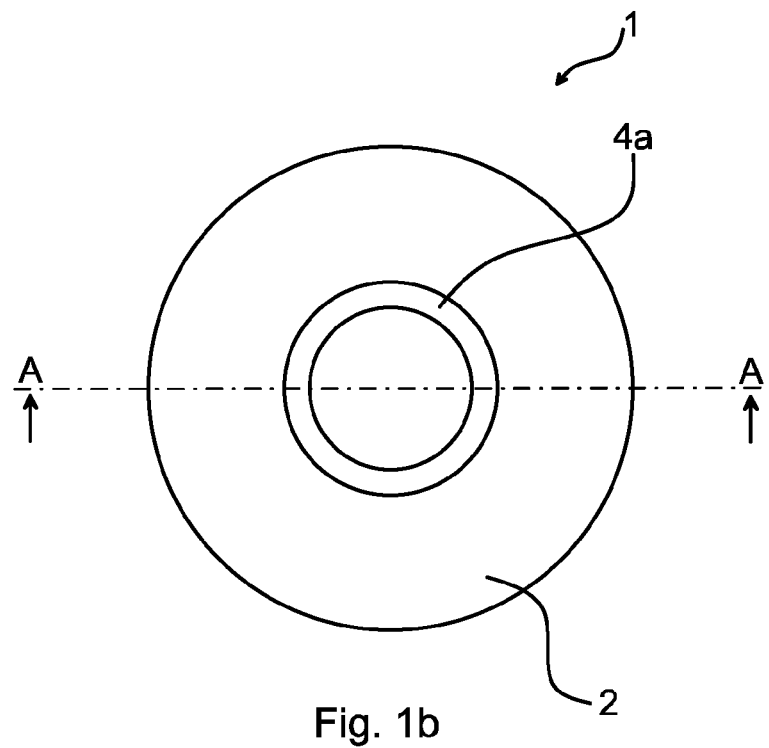

The main body 2 in the present example is rotationally symmetrically shaped with respect to the axis L. Typically, the main body 2 may be torus shaped or toroidal shaped. Hereto, a schematic top view of the high voltage shielding device 1 is shown in FIG. 1b illustrating an exemplary shape thereof.

The main body 2 is manufactured from an insulating material which is solid, such as for instance pressboard. Similar insulating non-fluid materials may also be used for manufacturing the main body 2 within the scope of the invention. The insulating material forms the outer solid insulating wall 2-1 of the main body 2.

The outer electrode 3 is arranged on the inside, facing the axis L, of the outer solid insulating wall 2-1. The outer electrode 3 has a side facing the inner peripheral surface of the outer solid insulating wall 2-1. The side facing the inner peripheral surface presents a surface 3-1 of the outer electrode 3, which surface 3-1 contacts the inner peripheral surface along the entire length of the outer electrode 3. Thereby no gaps are present between the surface 3-1 and the outer solid insulating wall 2-1. Advantageously, no oil gaps will hence be present when the high voltage shield device 1 is arranged in a high voltage insulating system, such as the high voltage insulating system 6 which will be described in more detail with reference to FIG. 2. The outer solid insulating wall 2-1 provides a first insulating level of the outer electrode 3.

Referring again to FIG. 1*a*, it can be seen that the main body 2 has an inner solid insulating wall 2-2 presenting a wall which is substantially parallel with the central axis L. This configuration may be advantageous when producing the main body 2. The main body 2 hence encloses the outer electrode 3. However, a variation of the invention which does not comprise the inner solid insulating wall 2-2 is also envisaged herein. In this envisaged variation, the outer electrode is hence not enclosed by the main body.

The outer electrode 3 may advantageously be arranged along the entire inner peripheral surface of the main body 2. Thereby, the outer electrode may provide shielding of the electric field $E_1$ in all radial directions r.

The first and second inner electrodes 4*a* and 4*b*, which normally but not necessarily are identical, are arranged so as to shield an electric field $E_2$ parallel with the central axis L. In the presently exemplified variation of the invention, the inner electrodes 4*a* and 4*b* are physically separate from the outer electrode 3. It is however envisaged that in one variation of the invention, the first and second inner electrode are integrated with the outer electrode. In this case a main electrode is provided, which has a central portion corresponding to the outer electrode 3, and two end portions corresponding to the first and second inner electrodes 4*a* and 4*b*. The main electrode is in this case curved in a way so that the end portions shield an axial electric field and the central portion shields the radial electric field. Further, only the central portion is attached to the outer insulating wall so that the entire surface of the side facing the peripheral surface of the central portion is in contact with the peripheral surface. The central portion is hence insulated so as to provide a first level of insulation. Further, the main electrode is preferably arranged on an inner side of the outer insulating wall, with the end portions leaning radially away from the peripheral surface of the inner side.

In one variation of the high voltage shielding device, the first and the second inner electrodes are provided with an insulating layer such as for instance paint, a polymer coating, or a cellulose based coating. During manufacture of the first and second inner electrodes, said electrodes are coated by e.g. physical vapour deposition or a similar process. The insulating layer of the first and second inner electrodes provides a second insulation level which is lower than the first insulation level. By providing a lower insulation level than the first insulation level, most charges will be absorbed by the first and second inner electrodes.

The above arrangement with an insulating coating layer may also be applied to embodiments having the main electrode, wherein the end portions are coated in a similar way as described above. The middle portion is insulated in the same manner as previously described, i.e. by means of the outer insulating wall.

Figure 1C:
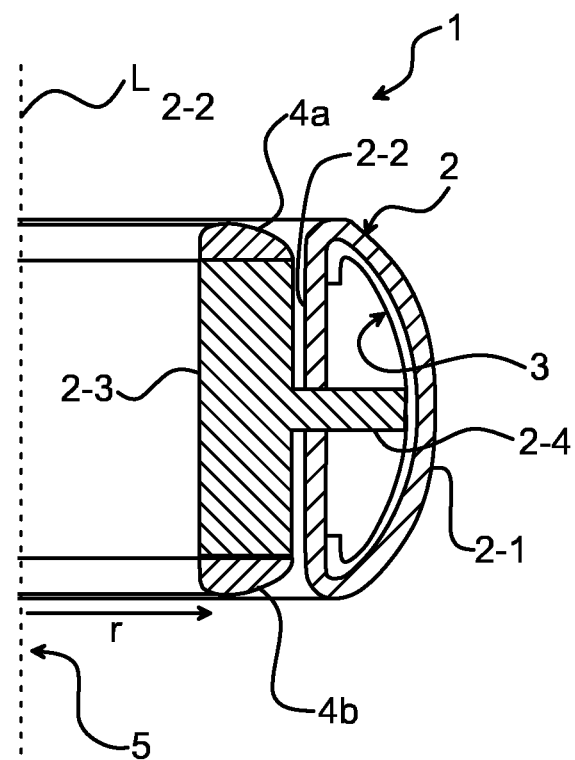
FIG. 1c shows a schematic cross-sectional view of another example of a high voltage shielding device.

With reference to FIG. 1*c*, an example of how the first inner electrode 4*a* and the second inner electrode can be mechanically supported within the main body 2 is shown. For simplicity, only the right hand side of the rotationally symmetric main body is shown with respect to the central axis L.

In the example of FIG. 1*c*, the first and the second inner electrodes 4*a* and 4*b* are mechanically coupled via a support member 2-3. The support member 2-3 has a protruding part or portion 2-4 which extends to the outer electrode 3 for supporting the outer electrode 3 such that the first inner electrode 4*a*, the second inner electrode 4*b* and the outer electrode 3 are mechanically coupled, thereby forming an electrode arrangement.

In one embodiment, the support member 2-3 is of the same material as the first inner electrode 4*a*, the second inner electrode 4*b* and the outer electrode 3, whereby each component of the electrode arrangement has essentially the same electric potential when a voltage is applied to the high voltage shielding device 1. Thus, in such an embodiment, the electrode arrangement is electrically coupled.

In one embodiment, the support member 2-3 is of a material different than that of the first inner electrode 4*a*, the second inner electrode 4*b* and the outer electrode 3.

In one embodiment, the electrode arrangement is an integrated structure.

The support member 2-3 may be arranged such that it extends between the first and the second inner electrodes 4*a* and 4*b*. The support member 2-3 may be mechanically fastened to the first and the second inner electrodes 4*a* and 4*b* e.g. by means of welding or by means of fasteners such as screws and/or nuts and bolts. The support member 2-3 may further be fixed or releaseably fixed to the main body 2 or the inner solid insulating wall 2-2, for instance by means of screws or other similar fastening means.

The support member 2-3 may be a beam or other similar type of support structure. Alternatively, the support member 2-3 may be arranged circumferentially along the interior surface of the main body 2. The protruding part or portion 2-4 may be an integrated part of the support member 2-3 or it may be a part releaseably fixed to the support member 2-3 in the form of a screw or similar fastener.

In one embodiment, the support member is mechanically coupled to the first and the second inner electrodes, and to the inner solid insulating wall only.

The support member may be made of metal, an insulating material or any material suitable for high voltage DC usage.

Figure 2:
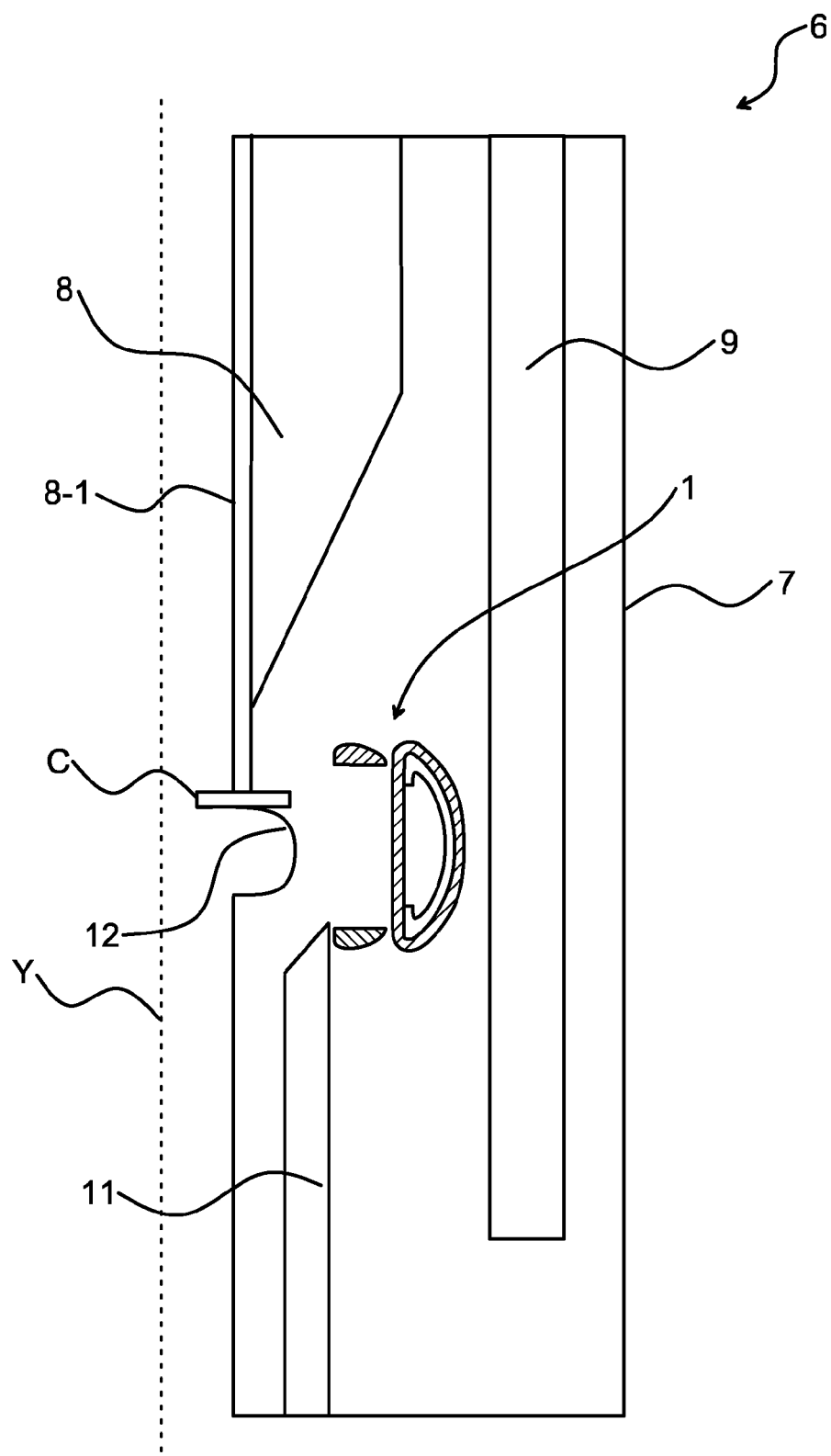
FIG. 2 shows a schematic cross-sectional view of an insulating system comprising the high voltage shielding device in FIGS. 1a-b.

FIG. 2 shows an application of the high voltage shielding device 1. More specifically, FIG. 2 shows the right side, with respect to a symmetry axis Y, of a high voltage insulating system 6. The system 6 has a turret wall 7, inside which turret wall 7 the system 6 comprises a bushing 8, a bushing conductor 8-1, a transformer conductor 12, which transformer conductor 12 with the bushing conductor 8-1 forms a connection C. The system 6 further comprises the high voltage shielding device 1, which encloses the connection C, a transformer side shielding 11, and an insulation barrier 9 which shields the bushing conductor 8-1 along its length. The turret wall 7 functions as ground for the system 6. The system 6 further comprises transformer oil or a similar dielectric fluid, wherein all of the components of the system are immersed in the dielectric fluid.

At the connection C very high electric fields are formed. The high voltage shielding device 1 according to the present invention provides for efficient shielding of the electric fields in both the radial direction as well as the axial direction in HVDC systems.

Beneficially, the system 6 may be manufactured by a method which comprises the steps that a power transformer, a bushing, and the high voltage shielding device 1 may all be produced in separate independent processes. Advantageously, the system 6 may be installed on-site.

It will be obvious that the present invention may be varied in a plurality of ways. Such variations are not to be regarded as departure from the scope of the present invention as defined by the appended claims. The skilled person in the art would understand in what other type of applications the present method would be useful.

What is claimed is:

1. A high voltage shielding device comprising:
a main body having a through opening extending centrally through the main body, the through opening forming part of an interior of the high voltage shielding device, wherein the main body has an enclosing outer solid insulating wall enclosing the interior of the high voltage shielding device, and wherein the main body has a rotationally symmetric shape with respect to a central axis parallel with the through opening and which central axis defines a center of the through opening,
an outer electrode arranged on the solid insulating wall providing a first level of insulation to the outer electrode, and
a first inner electrode which has a coating providing a second level of insulation, which second level of insulation is lower than the first level of insulation,
a second inner electrode facing the first inner electrode, wherein the second inner electrode has the second level of insulation, wherein the through opening extends from the first inner electrode to the second inner electrode,
wherein the first inner electrode is oriented relative the outer electrode in such a way that the first inner electrode mainly shields a component of an electric field which is perpendicular to a component of an electric field mainly shielded by the outer electrode, the outer electrode thereby shielding electric fields in a radial direction of the high voltage shielding device and the first inner electrode shielding electric fields in an axial direction of the high voltage shielding device, and wherein a side of the outer electrode facing the solid insulating wall presents a surface which is in contact with the solid insulating wall along the entire length of the outer electrode.

2. The high voltage shielding device as claimed in claim 1, wherein the outer electrode is arranged on an inner surface of the solid insulating wall.

3. The high voltage shielding device as claimed in claim 1, wherein the outer electrode extends longitudinally parallel to the central axis.

4. The high voltage shielding device as claimed in claim 1, wherein the first inner electrode extends longitudinally in a direction transverse to the central axis.

5. The high voltage shielding device as claimed in claim 1, wherein the outer electrode has a curvature.

6. The high voltage shielding device as claimed in claim 1, wherein the insulating wall is of a homogeneous material.

7. The high voltage shielding device as claimed in claim 1, comprising a support member arranged to support each of the first inner electrode, the second inner electrode, and the outer electrode.

8. A high voltage insulation system comprising:
the high voltage shielding device as claimed in claim 1,
a bushing having a conductor connectable to a transformer conductor,
wherein the high voltage shielding device is arranged to shield the connection between the conductor and the transformer conductor when connected.

9. The high voltage insulation system as claimed in claim 8, wherein the high voltage shielding device is arranged to enclose the connection between the conductor and the transformer conductor.

10. The high voltage insulation system as claimed in claim 8, wherein the high voltage shielding device and the bushing are immersed in transformer oil.

11. The high voltage insulation system as claimed in claim 8, further comprising a cylindrical insulation barrier enclosing the high voltage shielding device.

12. The high voltage shielding device as claimed in claim 1, wherein the high voltage shielding device is arranged to shield a bushing to transformer connection in an HVDC transformer.

* * * * *